US011959992B2

(12) United States Patent
Swaans et al.

(10) Patent No.: US 11,959,992 B2
(45) Date of Patent: Apr. 16, 2024

(54) METHODS AND SYSTEMS FOR PROVIDING A SECONDARY REFERENCE FOR EVALUATION OF WIRELESS POWER MEASURING ACCURACY, AND FOR EVALUATING A POWER MEASURING ACCURACY OF A WIRELESS POWER MEASUREMENT DEVICE UNDER TEST

(71) Applicant: ElectDis AB, Malmö (SE)

(72) Inventors: Laurens Swaans, Malmö (SE); Max Andersson, Malmö (SE); Arianna Amaya, Malmö (SE)

(73) Assignee: ElectDis AB, Malmö (SE)

( * ) Notice: Subject to any disclaimer, the term of this patent is extended or adjusted under 35 U.S.C. 154(b) by 0 days.

(21) Appl. No.: 18/247,569

(22) PCT Filed: May 11, 2022

(86) PCT No.: PCT/EP2022/062818
§ 371 (c)(1),
(2) Date: Mar. 31, 2023

(87) PCT Pub. No.: WO2022/238498
PCT Pub. Date: Nov. 17, 2022

(65) Prior Publication Data
US 2023/0393227 A1 Dec. 7, 2023

(30) Foreign Application Priority Data
May 14, 2021 (EP) .................................... 21173878

(51) Int. Cl.
*G01R 35/00* (2006.01)
*H02J 50/10* (2016.01)
(52) U.S. Cl.
CPC ............ *G01R 35/007* (2013.01); *H02J 50/10* (2016.02)

(58) Field of Classification Search
CPC ....... G01R 35/007; G01R 35/00; H02J 50/10; H02J 50/60; Y02T 10/7072
(Continued)

(56) References Cited
U.S. PATENT DOCUMENTS

2017/0317536 A1\* 11/2017 Marson .................. H02J 50/10
2019/0011523 A1\* 1/2019 Avestruz .............. G01R 35/005

FOREIGN PATENT DOCUMENTS

CN 102439669 A \* 5/2012 .............. B60L 53/12

OTHER PUBLICATIONS

Chu Sung Yul et al., "Electromagnetic Model-Based Foreign Object Detection for Wireless Power Transfer", Ó2019 IEEE, 8 pages.
(Continued)

*Primary Examiner* — Tung X Nguyen
*Assistant Examiner* — Robert P Alejnikov, Jr.
(74) *Attorney, Agent, or Firm* — Honigman LLP

(57) ABSTRACT

A first method (100) of providing a secondary reference for subsequent use in evaluating a power measuring accuracy of a wireless power measurement device (60) under test is presented. An inanimate calibration object (50) is subjected (110) to electromagnetic field variations (38) by controlling operating points of a reference wireless power transmitter device (30). Key power absorption parameters (58) of the calibration object (50) resulting from the electromagnetic field variations (38) are generated (120) and stored (130) together with data (57) that defines the operating points in a data storage (52) being associated (54) with the calibration object (50). A second method (200) of evaluating a power measuring accuracy of a wireless power measurement device (60, DUT) under test then involves providing (210) an inanimate calibration object, and retrieving (220), from a data storage (52) associated with the calibration object (50), stored key power absorption parameters (58) for the cali-
(Continued)

bration object together with data (57) that defines operating points. The second method (200) further involves subjecting (230) the calibration object (50) to electromagnetic field variations (68) by causing the wireless power measurement device (60, DUT) to operate at the operating points defined by the retrieved data (57), obtaining (240) key power absorption parameters of the calibration object resulting from the electromagnetic field variations (68); and comparing the obtained key power absorption parameters and the retrieved key power absorption parameters (58) to obtain a measurement result being indicative of the power measuring accuracy of the wireless power measurement device (60, DUT).

10 Claims, 4 Drawing Sheets

(58) Field of Classification Search
USPC .......................................................... 324/601
See application file for complete search history.

(56) References Cited

OTHER PUBLICATIONS

International Search Report with Written Opinion issued in Application No. PCT/EP2022/062818 dated Oct. 4, 2022, 10 pages.

\* cited by examiner

METHODS AND SYSTEMS FOR PROVIDING A SECONDARY REFERENCE FOR EVALUATION OF WIRELESS POWER MEASURING ACCURACY, AND FOR EVALUATING A POWER MEASURING ACCURACY OF A WIRELESS POWER MEASUREMENT DEVICE UNDER TEST

CROSS-REFERENCE TO RELATED APPLICATIONS

This application is the U.S. National Stage application under 35 U.S.C. 371 of International Application No. PCT/EP2022/062818, filed May 11, 2022, which claims priority to European Patent Application No. 21173878.6 filed on May 14, 2021. The entire contents of both applications are incorporated herein by reference in their entirety.

TECHNICAL FIELD

The present invention generally relates to the field of wireless power transfer, and more specifically to testing of wireless power transfer equipment. Even more specifically, the present invention relates to a method of providing a secondary reference for subsequent use in evaluating a power measuring accuracy of a wireless power measurement device under test, and an associated system. The present invention also relates to a method of evaluating a power measuring accuracy of a wireless power measurement device under test, and an associated system.

BACKGROUND

Wireless power transfer is growing increasingly popular, for instance for wireless battery charging of mobile devices like mobile terminals, tablet computers, laptop computers, cameras, audio players, electric toothbrushes, wireless headsets and smart watches, as well as various other consumer products and appliances.

The Wireless Power Consortium has developed a wireless power transfer standard known as Qi. Other known wireless power transfer initiatives include Alliance for Wireless Power, and Power Matters Alliance.

The wireless power transfer standard known as Qi by the Wireless Power Consortium will be referred to, without limitation, throughout this document as the presently preferred wireless power transfer manner applicable to the present invention. However, the invention may generally be applied also to other wireless power transfer standards or initiatives, including but not limited to the ones mentioned above.

Operation of devices that comply with Qi relies on magnetic induction between planar coils. Two kinds of devices are involved, namely devices that provide wireless power (referred to as base stations or power transmitter products), i.e. wireless power transmitter devices, and devices that consume wireless power (referred to as mobile devices or power receiver products), i.e. wireless power receiver devices. Power transfer takes place from a base station to a mobile device. For this purpose, a base station contains a subsystem (a power transmitter) that comprises a primary coil, whereas a mobile device contains a subsystem (a power receiver) that comprises a secondary coil. In operation, the primary coil and the secondary coil will constitute the two halves of a coreless resonant transformer. Typically, a base station has a flat surface, on top of which a user can place one or more mobile devices so as to enjoy wireless battery charging or operational power supply for the mobile device(s) placed on the base station.

This can be seen in FIG. 1 which illustrates a wireless power transmitter device for wireless power transfer to a mobile device 10 (or power receiver product), i.e., a wireless power receiver device. The mobile device 10 may, for instance, be a mobile terminal (e.g. smart phone) 10a, tablet computer 10b (e.g. surf pad), laptop computer smart watch 10d, camera, audio player, rechargeable toothbrush, wireless headset, or another kind of consumer product or appliance.

Since the wireless power transfer is exemplified in this document as being compliant with the Qi standard by the Wireless Power Consortium, the wireless power transmitter device 20 is a base station or power transmitter product in the Qi terminology. However, the invention is—as mentioned above—generally applicable also to other wireless power transfer standards or approaches.

The wireless power transmitter device 20 comprises a wireless power transmitter 22 having a wireless power transmitter coil 24 and being controlled by a power controller 26. Correspondingly, the mobile device 10 comprises a wireless power receiver 12 having a wireless power receiver coil 14. In operation, the wireless power transmitter device 20 will transfer power wirelessly to the mobile device 10 by way of magnetic induction 18 via the wireless power transmitter coil 24 and wireless power receiver coil 14.

The power received by the wireless power receiver coil 14 will drive a load 16 in the mobile device 10. Typically, the load 16 may be a rechargeable battery, such as a lithium ion battery; hence, the wireless power transmitter device 20 will act as a wireless power charger for the mobile device 10. In another scenario, the load 16 may be electronic circuitry in the mobile device, wherein the wireless power transmitter device 20 will act as a wireless power supply for the mobile device 10.

Throughout this document, wireless charging will be used as an example of wireless power transfer, i.e. a species among a genus, without limitation.

An important aspect of wireless power transfer is safety. It is recalled that the Qi specification describes how a wireless power transmitter device (such as device 20 in FIG. 1) can transfer energy to a wireless power receiver device (such as device 10 in FIG. 1) by using electromagnetic fields. A known downside of using electromagnetic fields is that these fields can cause heating of metallic objects that are exposed to the field. For this reason, devices that utilize the Qi specification have built-in protection against such undesired heating of foreign objects. Such protection is commonly referred to as foreign object detection (FOD) and is based on measurements of power and/or energy on both sides of the electromagnetic field (i.e. the transmitter and receiver sides, cf. devices 20 and 10 in FIG. 1). During the course of a wireless power transfer session, the wireless power receiver device 10 will regularly communicate to the wireless power transmitter device 20 the amount of power it is consuming. Since the wireless power transmitter device 20 can measure the power it is transmitting, it can calculate the difference between these two (transmitted power minus received power), wherein the calculated difference is assumed to be unintentionally absorbed by other objects that could cause heating.

Therefore, it is clear to the skilled person that accurate power measurements are essential in the field of wireless power transfer. Apart from safety aspects related to foreign object detection, there is also a need for accurate power measurements when it comes to measuring and determining the efficiency of a wireless power system. With programs such as EnergyStar, a reliable rating of device performance becomes a competitive aspect for products offering wireless power transfer. These needs may exist in various interest groups, such as developers, manufacturers or suppliers of mobile devices; developers, manufacturers or suppliers of wireless power transmitter devices; test or compliance entities in the field of wireless power transfer; and test or compliance entities in the field of consumer product safety.

Accurate power measurements in wireless power transfer devices pose a challenge in several aspects as compared to commonly available AC power measurement equipment in general. The signal frequency is much higher, in the order of 100 kHz as compared 100 Hz, i.e. a thousand times higher. Furthermore, the harmonic distortion is much higher, because of square waves versus sine waves. Moreover, the nature of a wireless power transfer system implies low ratio of real power versus apparent power (or, alternatively phrased, that there is a substantial amount of reactive power, because what is charged is far from an ideal resistive load).

Finding a reliable power reference for these applications is challenging and requires building of extremely accurate measurement equipment. Prior art approaches to highly accurate systems, devices and methods for power measurements being particularly suited for wireless power transfer equipment are described in EP 3 035 490 A1 and WO 2018/197553 A1.

Related art is disclosed in US 2017/317536 A1, US 2019/011523 A1 and CHU SUNG YUL ET AL: "Electromagnetic Model-Based Foreign Object Detection for Wireless Power Transfer", 2019 20TH WORKSHOP ON CONTROL AND MODELING FOR POWER ELECTRONICS (COMPEL), IEEE, 17 Jun. 2019.

The present inventors have realized that there is a need for a simple measurement verification that can indicate whether a power measurement device is measuring accurately or not.

SUMMARY

Accordingly, it is an object of the invention to offer improvements in power measurements for wireless power transfer equipment and to eliminate or mitigate one or more of the problems identified above.

An inventive understanding behind the present invention is the characterization of power loss in inanimate objects when being subjected to an electromagnetic field. Different materials may have different characteristics at different frequencies, which makes such inanimate objects very suitable for verification of measurements, for instance for calibration purposes. Accordingly, once a specific inanimate object has been characterized in terms of, for instance, its power losses or electromagnetic impedance when being subjected to certain particular electromagnetic field conditions, these characteristics will not change over time. Hence, the same inanimate object exposed to the same particular electromagnetic field conditions will be subject to the same power absorption. This will allow using such inanimate objects as calibration references for various measurements, in particular for power measurements in a wireless power transfer system.

The characteristics of the calibration objects may typically have to be obtained by using very accurate (and relatively speaking expensive) and sophisticated measurement tools. However, once having been measured upon by such a sophisticated measurement tool, the calibration object becomes a secondary standard on its own to the extent at which it was evaluated by the sophisticated measurement tool measurement tool. The calibration object may then be used in an inexpensive manner as a secondary reference for the sophisticated measurement tool for the purpose of verifying power measurements.

In consideration of the above, a first inventive aspect is a method of providing a secondary reference for subsequent use in evaluating a power measuring accuracy of a wireless power measurement device under test. The method comprises subjecting an inanimate calibration object to electromagnetic field variations by controlling operating points of a reference wireless power transmitter device, and generating key power absorption parameters of the calibration object resulting from the electromagnetic field variations. The method further comprises storing the measured key power absorption parameters together with data that defines the operating points in a data storage associated with the calibration object.

The method according to the first inventive aspect thus turns a calibration object into a secondary reference for wireless power transfer measurements.

A second inventive aspect is a method of evaluating a power measuring accuracy of a wireless power measurement device under test. The method according to the second inventive aspect comprises providing an inanimate calibration object, typically being a calibration object that has undergone the method according to the first inventive aspect. The method according to the second inventive aspect further comprises retrieving, from a data storage associated with the calibration object, stored key power absorption parameters for the calibration object together with data that defines operating points. The calibration object is subjected to electromagnetic field variations by causing the wireless power measurement device to operate at the operating points defined by the retrieved data. Key power absorption parameters of the calibration object resulting from the electromagnetic field variations are obtained. The method according to the second inventive aspect then comprises comparing the obtained key power absorption parameters and the retrieved key power absorption parameters to obtain a measurement result, which is indicative of a power measuring accuracy of the wireless power measurement device.

The wireless power measurement device in the method according to the second inventive aspect may, for instance, be a wireless power transmitter device subject to a wireless power transfer compliance test, such as a Qi compliance test.

A third inventive aspect is a system for providing a secondary reference for subsequent use in evaluating a power measuring accuracy of a wireless power measurement device under test. The system comprises a reference wireless power transmitter device, a host device and a data storage.

The reference wireless power transmitter device and the host device are configured for:
  subjecting an inanimate calibration object to electromagnetic field variations by controlling operating points of the reference wireless power transmitter device; and
  generating key power absorption parameters of the calibration object resulting from the electromagnetic field variations, and The data storage is configured for:
  storing the generated key power absorption parameters together with data that defines the operating points in a data storage being associated with the calibration object.

A fourth inventive aspect is a system for evaluating a power measuring accuracy of a wireless power measurement device under test. The system further comprises a data storage which is associated with an inanimate calibration object. The system moreover comprises a host device being configured for:

retrieving, from the data storage, stored key power absorption parameters for the calibration object together with data that defines operating points;

causing the wireless power measurement device to operate at the operating points defined by the retrieved data, thereby subjecting the calibration object to electromagnetic field variations;

obtaining key power absorption parameters of the calibration object resulting from the electromagnetic field variations; and comparing the obtained key power absorption parameters and the retrieved key power absorption parameters to obtain a measurement result being indicative of the power measuring accuracy of the wireless power measurement device.

In the system according to the fourth inventive aspect, said key power absorption parameters and said data that defines operating points may have been pre-stored in said data storage by operating said data storage in a system for providing a secondary reference according to the third inventive aspect.

Other aspects, objectives, features and advantages of the disclosed embodiments will appear from the following detailed disclosure, from the attached dependent claims as well as from the drawings. Generally, all terms used in the claims are to be interpreted according to their ordinary meaning in the technical field, unless explicitly defined otherwise herein.

All references to "a/an/the [element, device, component, means, step, etc.]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Objects, features and advantages of embodiments of the invention will appear from the following detailed description, reference being made to the accompanying drawings.

DETAILED DESCRIPTION

Figure 1:
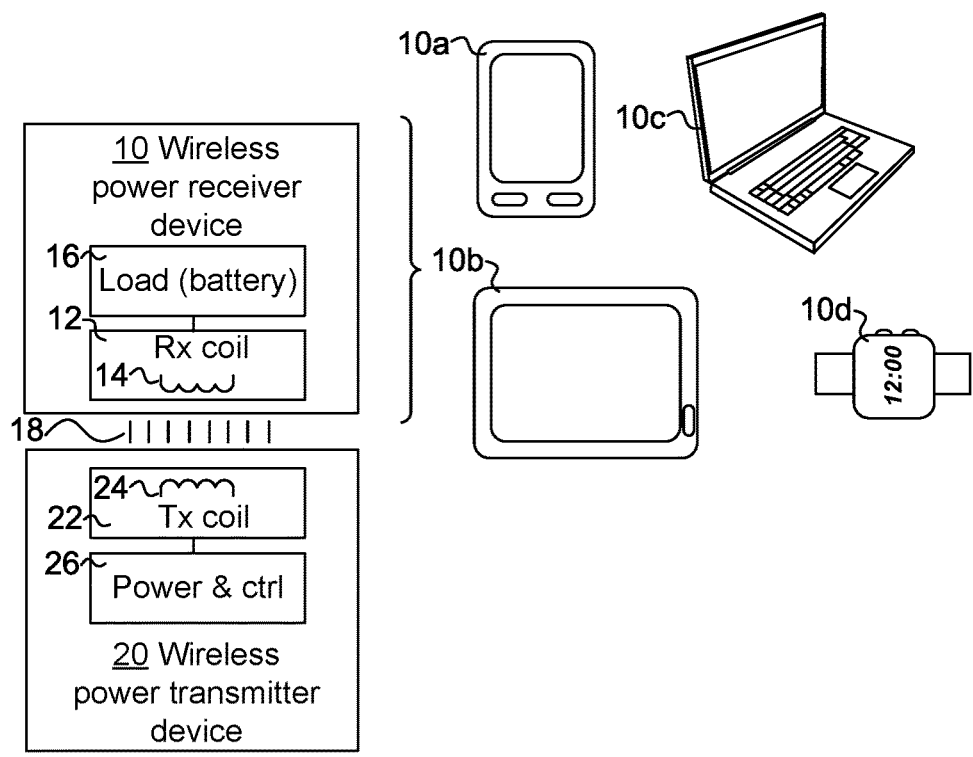
FIG. 1 is a schematic block diagram of a wireless power transmitter device for wireless power transfer to a wireless power receiver device.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements. Elements illustrated as hatched boxes are generally to be seen as optional in the particular drawing in which they appear.

Figure 2C:
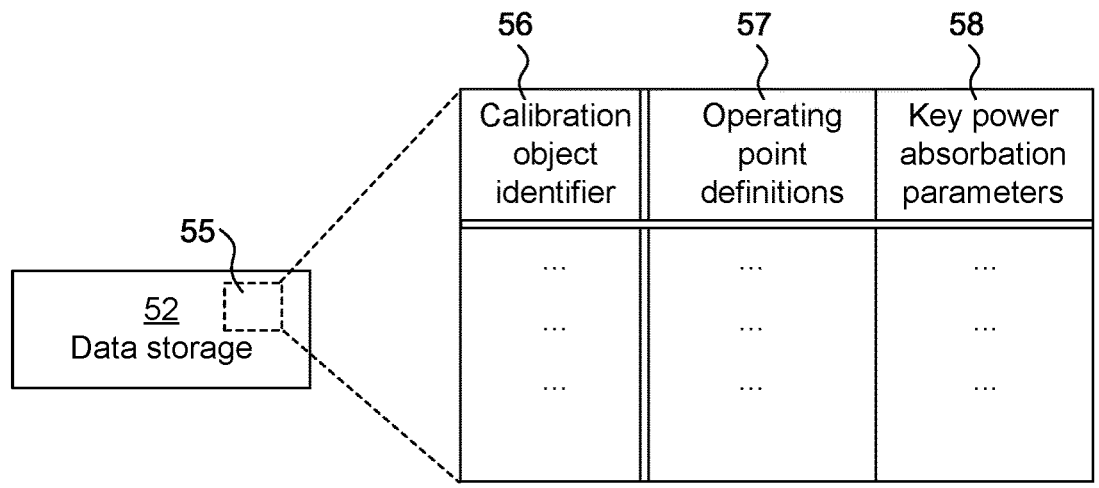
FIG. 2C is a schematic illustration of a data storage associated with the inanimate calibration object.
Figure 2A:
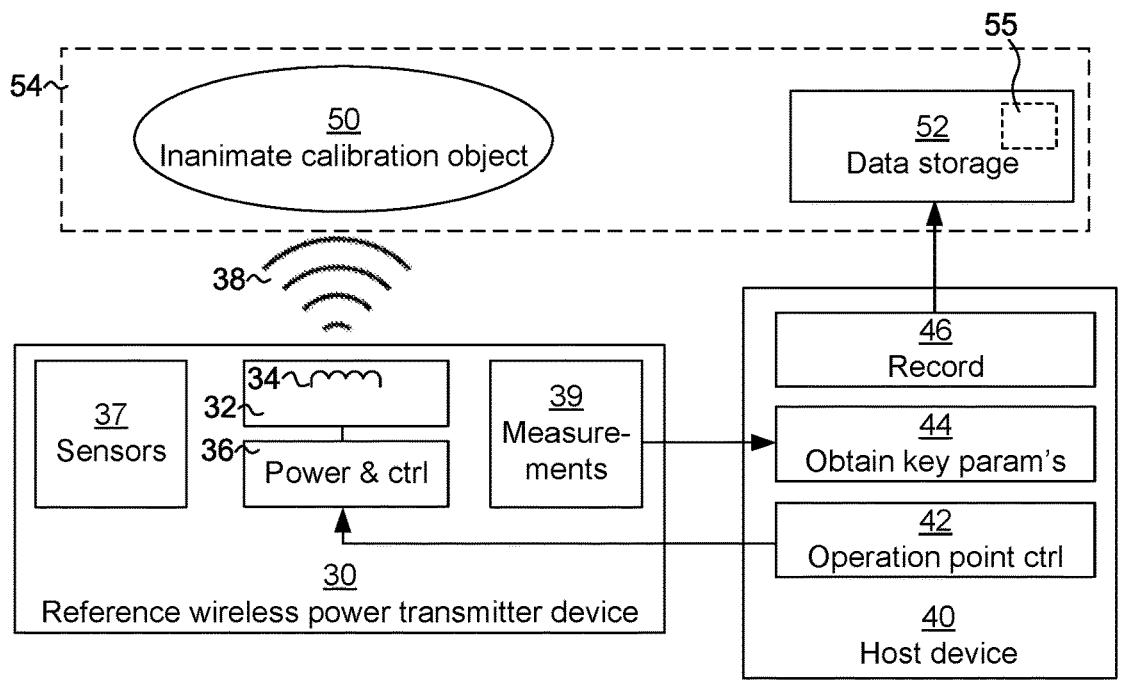
FIG. 2A is a schematic illustration of a system for providing a secondary reference for subsequent use in evaluating a power measuring accuracy of a wireless power measurement device under test based on an inanimate calibration object.

FIG. 2A illustrates a system for providing a secondary reference, in the form of an inanimate calibration object 50, for subsequent use in evaluating a power measuring accuracy of a wireless power measurement device under test. The inanimate calibration object 50 is a physical object, the electromagnetic absorption properties of which remain invariant over time or, alternatively, change deterministically over time. To this end, the inanimate calibration object 50 may advantageously be a solid metal object, such as a block or cylinder, a volume of a liquid metal, such as mercury, or an object made of a composite material, such as a metal powder mixed with a binder, or metal-reinforced glass or plastics. However, the inanimate calibration object 50 may take other alternative forms, as the skilled person will understand once being enlightened by the present disclosure.

The system in FIG. 2A comprises a reference wireless power transmitter device a host device 40 and a data storage 52. The reference wireless power transmitter device 30 comprises a wireless power transmitter 32 having a wireless power transmitter coil 34 and being driven by a power controller 36. The wireless power transmitter 32 is capable of generating a varying electromagnetic field 38 under the control of the power controller 36. When the inanimate calibration object 50 is put onto a housing of the wireless power transmitter device 30, or is otherwise brought in proximity to the wireless power transmitter 32, the inanimate calibration object 50 will be subjected to the electromagnetic field 38.

The reference wireless power transmitter device 30 further comprises one or more sensors 37, at least one of which preferably being a temperature sensor for measuring a surface temperature at a portion of the housing of the reference wireless power transmitter device 30 where the inanimate calibration object 50 is put.

The reference wireless power transmitter device 30 moreover comprises measurement circuitry or functionality 39 operatively coupled to the wireless power transmitter coil 34 and being configured to measure or determine various measurement data, such as one or more of the current, voltage or impedance of electric signals flowing in the wireless power transmitter coil 34. As the skilled person will understand, these electric signals will be affected not only by the drive signals fed from the power controller 36, but also by the electromagnetic (or inductive) interaction with the inanimate calibration object 50.

In embodiments of the invention, the reference wireless power transmitter device 30 is a CATS II Mobile Device Tester which is commercially available from nok9 AB, Stora Tradgardsgatan 30, SE 211 28 Malmö, Sweden. In these or other embodiments of the invention, the reference wireless power transmitter device 30 is compliant with the Test Power Transmitter described in chapter 4 of "The Qi Wireless Power Transfer System", Power Class 0 Specification, Part 3: Compliance Testing, version 1.2.4, February 2018, or any compatible subsequent version of this specification.

The host device 40 comprises circuitry or functionality 42 for controlling the operating points of the reference wireless power transmitter device 30. The operating points may, for instance, be defined directly or indirectly by the frequency of the electromagnetic field 38 generated by the wireless power transmitter coil 34, the magnitude of the electromagnetic field 38, the shape of the electromagnetic field 38, the direction of the electromagnetic field 38, the surface temperature as measured by one or more of the sensors 37, or any combination or derivative thereof. As the skilled person will understand, the notion "directly or indirectly" means that the host device 40 must not necessarily measure the electromagnetic field 38 directly when controlling the operating points of the reference wireless power transmitter device 30. Rather, the circuitry or functionality 42 may make or retrieve measurements on the current flowing the wireless power transmitter coil 34 (such as amplitude and frequency), and from those measurements determine one or more of the frequency, magnitude, shape and direction of the electromagnetic field 38 generated by the current in the wireless power transmitter coil 34.

The controlling of the operating points of the reference wireless power transmitter device 30 will cause controlled variations in the electromagnetic field 38. Pursuant to the invention, key power absorption parameters 58 resulting from the electromagnetic field variations 38 are generated for the calibration object 50. The host device 40 has circuitry or functionality 44 for obtaining these key power absorption parameters 58. The key power absorption parameters 58 may be generated directly by the measurement circuitry or functionality 39 in the reference wireless power transmitter device 30 based on the measurement data it produces. Alternatively, the key power absorption parameters 58 may be generated by the circuitry or functionality 44 in the host device 40 based on the measurement data produced by the measurement circuitry or functionality 39 of the reference wireless power transmitter device 30. As another alternative, the key power absorption parameters 58 may be generated in a cooperative manner by the measurement circuitry or functionality 39 in the reference wireless power transmitter device 30 together with the circuitry or functionality 44 in the host device 40.

The key power absorption parameters 58 thus generated may, for instance, be defined by one or more of the following: the wireless transmitter coil current in the wireless power transmitter coil 34, the wireless transmitter coil voltage of the wireless power transmitter coil 34, the wireless power transmitted by the reference wireless power transmitter device 30, the electric impedance of the wireless power transmitter coil 34, and a Q factor of the wireless power transmitter coil 34.

The host device 40 further comprises circuitry or functionality 46 for recording the generated key power absorption parameters 58. This involves storing the generated key power absorption parameters 58 together with data 57 that defines the operating points in the data storage 52 being associated with the calibration object 50, as seen at 54. As can be seen in FIG. 2C, the association 54 between the data storage 52 and the calibration object 50 may be established by storing in the data storage 52 a data set 55 which comprises a calibration object identifier 56 together with the data 57 that defines the operating points and the generated key power absorption parameters 58. As the skilled person will understand, the data set 55 may represent just one calibration object 50 (as identified by the calibration object identifier 56), or alternatively several different calibration objects 50 being differentiated by their respective calibration object identifiers 56.

The data storage 52 may be any kind of suitable data storage, implemented for instance by computer-readable memory technologies such as ROM, RAM, SRAM, DRAM, FLASH, DDR or SDRAM, or by secondary storage technologies such as a solid state drive or a hard drive. From a software point of view, the data storage 52 may for instance be embodied in or as a database hosted by a host computer or server computer. The data storage 52 may be accessible by local or wide-area communication means, such as wireless communication like Bluetooth, WiFi, W-CDMA, GSM, UTRAN, HSPA, LTE, LTE Advanced or 5G, to name a few, or wired communication like simple electric wiring, serial communication like USB or Ethernet. Such communication may involve the Internet or a part thereof.

The interactions between the host device 40 and the reference wireless power transmitter device 30 as described above may be performed by any suitable communication means, for instance any of the local or wide-area communication means mentioned above.

Figure 3:
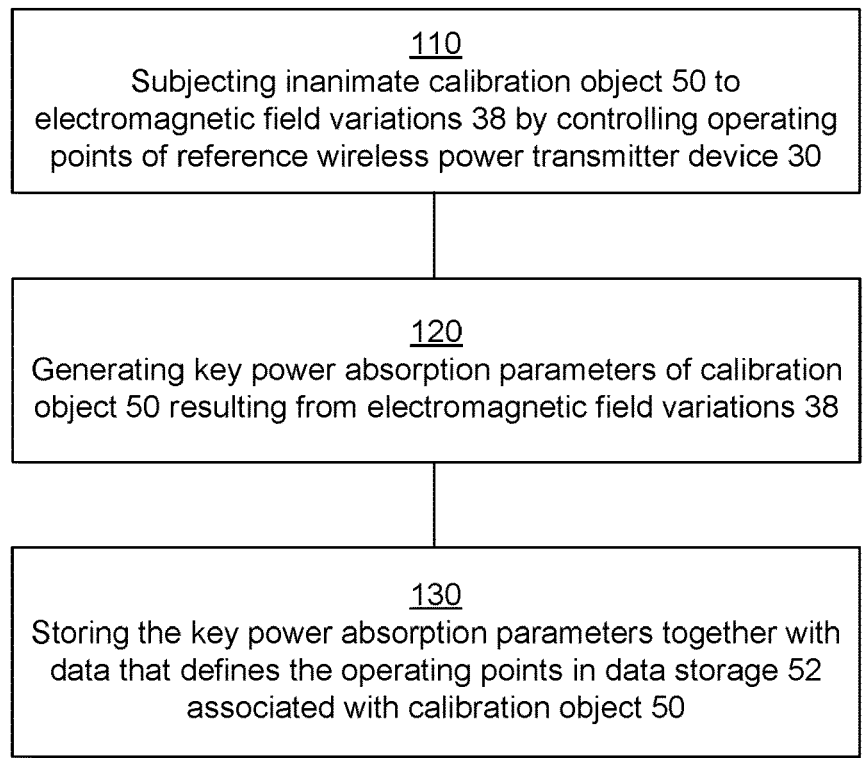
FIG. 3 is a schematic flowchart diagram illustrating a method of providing a secondary reference for subsequent use in evaluating a power measuring accuracy of a wireless power measurement device under test.

The functionality of the system described above for FIG. 2A can be summarized as follows with reference to the method 100 shown in FIG. 3. As can be seen in FIG. 3, a method 100 of providing a secondary reference for subsequent use in evaluating a power measuring accuracy of a wireless power measurement device under test is provided. The method 100 comprises subjecting 110 an inanimate calibration object 50 to electromagnetic field variations 38 by controlling operating points of a reference wireless power transmitter device 30. The method 100 further comprises generating 120 key power absorption parameters 58 for the calibration object 50 resulting from the electromagnetic field variations 38. The method 100 then comprises storing 130 the generated key power absorption parameters 58 together with data 57 that defines the operating points in a data storage 52 being associated 54 with the calibration object 50.

Figure 2B:
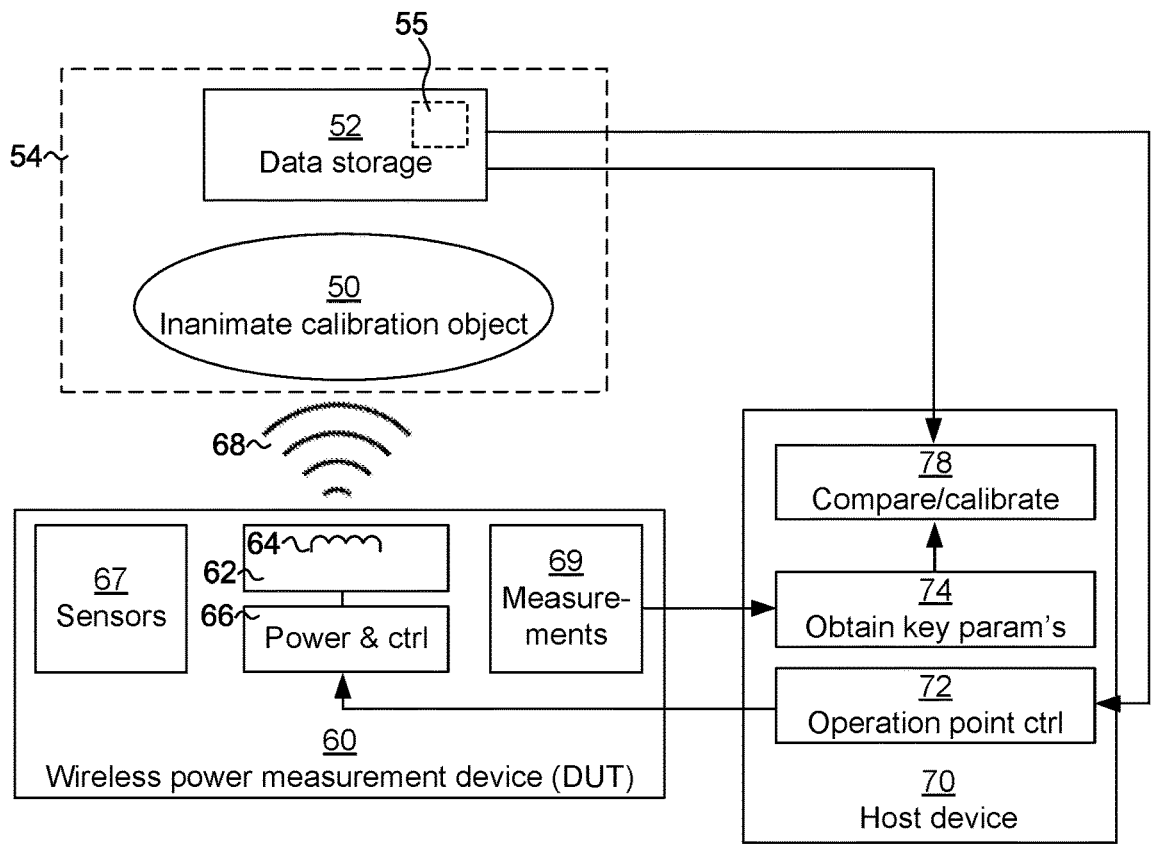
FIG. 2B is a schematic illustration of a system for evaluating a power measuring accuracy of a wireless power measurement device under test, using the inanimate calibration object.

FIG. 2B illustrates a system for evaluating a power measuring accuracy of a wireless power measurement device 60 under test by using as a secondary reference the inanimate calibration object 50 that was the subject of the system described above for FIG. 2A and the method 100 described above for FIG. 3.

The wireless power measurement device 60 is a device under test, DUT, and comprises a wireless power transmitter 62 having a wireless power transmitter coil 64 and being driven by a power controller 66. The wireless power transmitter 62 is capable of generating a varying electromagnetic field 68 under the control of the power controller 66. When the inanimate calibration object 50 is put onto a housing of the wireless power measurement device 60, or is otherwise brought in proximity to the wireless power transmitter 62, the inanimate calibration object 50 will be subjected to the electromagnetic field 68.

The wireless power measurement device 60 further comprises one or more sensors 67, at least one of which preferably being a temperature sensor for measuring a surface temperature at a portion of the housing of the wireless power measurement device 60 where the inanimate calibration object 50 is put.

The wireless power measurement device 60 moreover comprises measurement circuitry or functionality 69 operatively coupled to the wireless power transmitter coil 64 and being configured to measure or determine various measurement data, such as one or more of the current, voltage or impedance of electric signals flowing in the wireless power transmitter coil 64. Similarly to what has been noted for FIG. 2A above, the electric signals in the wireless power transmitter coil 64 will be affected not only by the drive signals fed from the power controller 66, but also by the electromagnetic (inductive) interaction with the inanimate calibration object 50.

The wireless power measurement device 60 under test may advantageously be a wireless power transmitter device, for instance a Base Station, Power Transmitter, Power Transmitter Product or Power Transmitter Product Unit as defined in the Qi specifications, subject to a wireless power transfer compliance test. The Qi specifications are available at https://www.wirelesspowerconsortium.com/. The wireless power transfer compliance test may thus, for instance, be any test performed upon the wireless power measurement device 60 to test its compliance with the Qi specifications.

Alternative embodiments can be envisaged where the wireless power measurement device 60 under test is wireless power receiver device, for instance a Mobile Device, Power Receiver, Power Receiver Product or Power Receiver Product Unit as defined in the Qi specifications, or the wireless power measurement device 60 may in fact itself be a wireless power compliance test device.

The system in FIG. 2B comprises a host device 70 and the aforementioned data storage 52. The host device 70 comprises circuitry or functionality 72 for controlling the operating points of the wireless power measurement device 60. Similarly to what has been noted for FIG. 2A above, the operating points may, for instance, be defined directly or indirectly by the frequency of the electromagnetic field 68 generated by the wireless power transmitter coil 64, the magnitude of the electromagnetic field 68, the shape of the electromagnetic field 68, the direction of the electromagnetic field 68, the surface temperature as measured by one or more of the sensors 67, or any combination or derivative thereof. Unlike FIG. 2A, however, the source of the operating points in FIG. 2B will be the aforementioned data 57 that has been pre-stored in the data storage 52 associated 54 with the calibration object 50 together with the key power absorption parameters 58 that were generated by the system in FIG. 2A and the method 100 in FIG. 3.

Hence, the host device 70 in FIG. 2B will read the aforementioned data set 55 from the data storage 52 being associated 54 with the calibration object 50, and retrieve from the data set 55 the stored key power absorption parameters 58 for the calibration object 50 together with the data 57 that defines operating points.

The circuitry or functionality 72 of the host device 70 will thus control the operating points of the wireless power measurement device 60 in accordance with the data 57 that has been retrieved from the data storage 52 associated with the calibration object 50. As the skilled person will understand, the host device 70 must not necessarily measure the electromagnetic field 68 directly when controlling the operating points. Rather, the circuitry or functionality 72 may make or retrieve measurements on the current flowing the wireless power transmitter coil 64 (such as amplitude and frequency), and from those measurements determine one or more of the frequency, magnitude, shape and direction of the electromagnetic field 68 generated by the current in the wireless power transmitter coil 64. Hence the notion "directly or indirectly" above.

The controlling of the operating points of the wireless power measurement device 60 will cause controlled variations in the electromagnetic field 68. Similar to FIG. 2A, key power absorption parameters resulting from the electromagnetic field variations 68 will be generated for the calibration object 50. The host device 70 has circuitry or functionality 74 for obtaining these key power absorption parameters.

The key power absorption parameters may be produced directly by the measurement circuitry or functionality 69 in the wireless power measurement device 60 based on the measurement data it produces. Alternatively, the key power absorption parameters may be obtained by the circuitry or functionality 74 in the host device 70 based on the measurement data produced by the measurement circuitry or functionality 69 of the wireless power measurement device 60, or cooperatively by the measurement circuitry or functionality 69 in the wireless power measurement device 60 together with the circuitry or functionality 74 in the host device 70.

The key power absorption parameters thus obtained in the system of FIG. 2B may—just like the key power absorption parameters 58 generated in the system of FIG. 2A—be defined by one or more of the following: the wireless transmitter coil current in the wireless power transmitter coil 64, the wireless transmitter coil voltage of the wireless power transmitter coil 64, the wireless power transmitted by the wireless power measurement device 60, the electric impedance of the wireless power transmitter coil 64, and a Q factor of the wireless power transmitter coil 64.

The host device 70 further comprises circuitry or functionality 76 for comparing the obtained key power absorption parameters and the retrieved key power absorption parameters 58 to obtain a measurement result. Hence, the measurement result is based on a comparison between, on one hand, the key power absorption parameters that are obtained by the system in FIG. 2B for the calibration object 50 when the wireless power measurement device 60 is controlled to the operating points defined by the data 57 read from the data storage 52, and on the other hand the key power absorption parameters 58 that have been previously generated by the system in FIG. 2A for the same calibration object 50 when the reference wireless power transmitter device 30 was controlled to the same operating points, these operating points being represented by the data 57.

The obtained measurement result will be indicative of a power measuring accuracy of the wireless power measurement device 60, i.e. the DUT. As previously mentioned, this may be part of a wireless power transfer compliance test that the wireless power measurement device 60 is being subjected to.

The circuitry or functionality 76 of the host device 70 may be further configured for tuning the wireless power measurement device 60 by iteratively adapting the operating points at which it is operated to minimize the difference between the key power absorption parameters as obtained by the system in FIG. 2B for the calibration object 50 and the key power absorption parameters 58 that have been retrieved from the data storage 52 associated with the calibration object 50, i.e. the key power absorption parameters 58 that were generated by the system in FIG. 2A for the calibration object 50.

Figure 4:
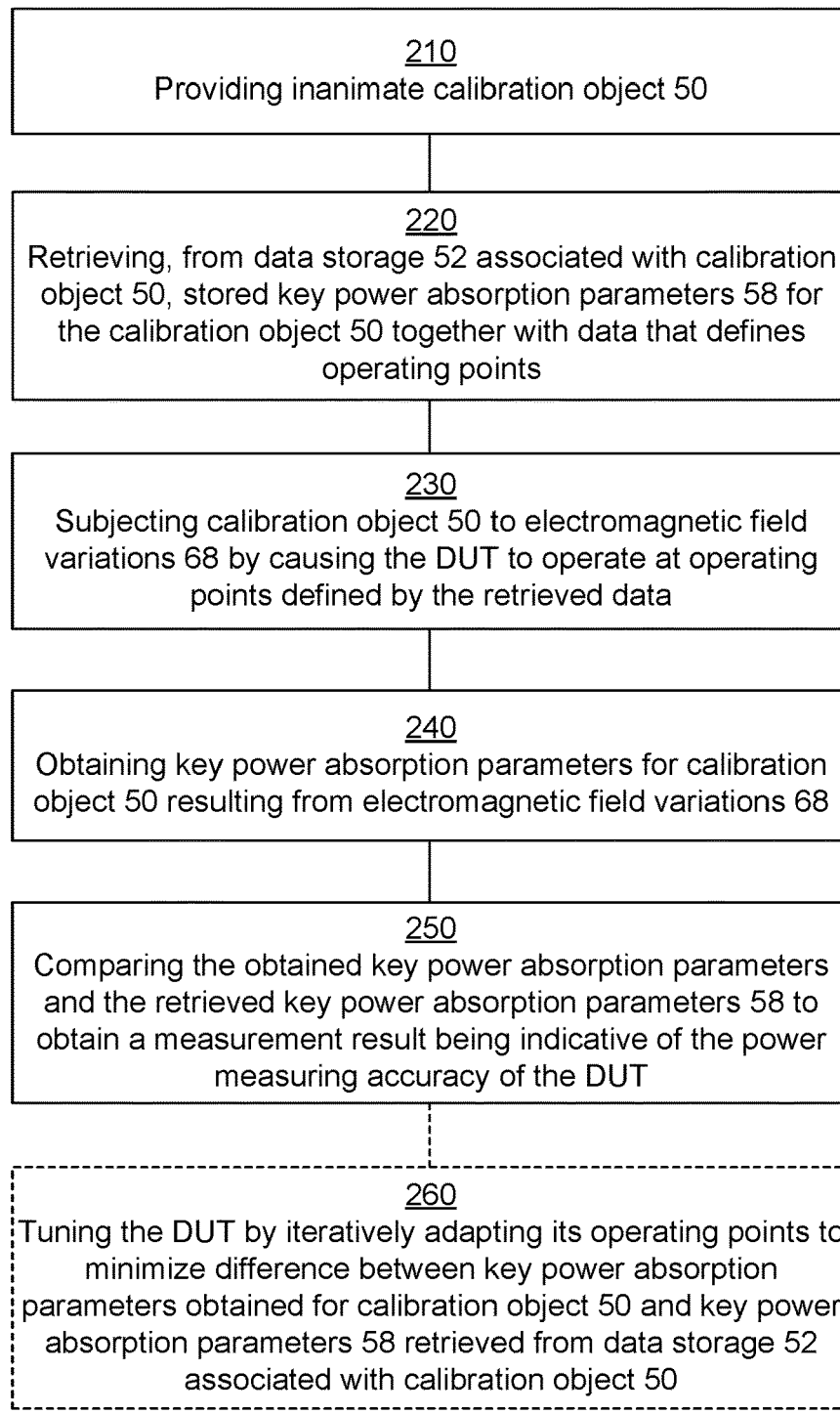
FIG. 4 is a schematic flowchart diagram illustrating a method of evaluating a power measuring accuracy of a wireless power measurement device under test.

The functionality of the system described above for FIG. 2B can be summarized as follows with reference to the method 200 shown in FIG. 4. As can be seen in FIG. 4, a method 200 of evaluating a power measuring accuracy of a wireless power measurement device 60 under test (DUT) is provided. The method 200 comprises providing 210 an inanimate calibration object 50 which typically has undergone the method 100 in FIG. 3. The method 200 further comprises retrieving 220, from a data storage 52 associated 54 with the calibration object 50, stored key power absorption parameters 58 for the calibration object 50 together with data 57 that defines operating points. The calibration object 50 is subjected 230 to electromagnetic field variations 68 by causing the wireless power measurement device 60 to operate at the operating points defined by the retrieved data 57. The method 200 further comprises obtaining 240 key power absorption parameters of the calibration object 50 resulting from the electromagnetic field variations 68, and comparing 250 the obtained key power absorption parameters with the retrieved key power absorption parameters 58 to obtain a measurement result being indicative of the power measuring accuracy of the wireless power measurement device 60 under test.

As should be fully clear from the disclosure above, the functionality of the methods and systems in FIGS. 2A, 2B, 3 and 4 serves the purpose of allowing evaluation of a power measuring accuracy of a wireless power measurement device in a test situation (such as compliance testing). This is not to be confused with a conventional functionality for foreign object detection, FOD, during normal (end-user) operation of a pair of wireless power transmitter and receiver devices performing wireless power transfer between each other.

As the skilled person will understand, the methods in FIGS. 3 and 4 can alternatively be considered as first and second parts of one common method of evaluating a power measuring accuracy of a wireless power measurement device 60 under test. The first part of such a common method would involve subjecting 110 an inanimate calibration object 50 to electromagnetic field variations 38 by controlling operating points of a reference wireless power transmitter device 30, followed by the generating 120 of key power absorption parameters 58 of the calibration object 50 resulting from the electromagnetic field variations 38, and the storing 130 of the generated key power absorption parameters 58 together with data 57 that defines the operating points in a data storage 52 being associated 54 with the calibration object 50.

The second part of the common method would then, typically at a later time and place, involve retrieving 220, from the data storage 52, the stored key power absorption parameters 58 for the inanimate calibration object 50 together with the stored data 57 that defines the operating points, followed by subjecting 230 the calibration object 50 to electromagnetic field variations 68 by causing the wireless power measurement device 60 to operate at the operating points defined by the retrieved data 57. The second part of the common method would furthermore involve obtaining 240 key power absorption parameters of the calibration object 50 resulting from the electromagnetic field variations 68, and comparing 250 the obtained key power absorption parameters and the retrieved key power absorption parameters 58 to obtain a measurement result being indicative of the power measuring accuracy of the wireless power measurement device 60.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method of evaluating a power measuring accuracy of a wireless power measurement device under test, the method comprising:
   providing an inanimate calibration object;
   retrieving, from a data storage associated with the calibration object, stored key power absorption parameters for the calibration object together with data that defines operating points;
   subjecting the calibration object to electromagnetic field variations by causing the wireless power measurement device to operate at the operating points defined by the retrieved data;
   obtaining key power absorption parameters of the calibration object resulting from the electromagnetic field variations; and
   comparing the obtained key power absorption parameters and the retrieved key power absorption parameters to obtain a measurement result being indicative of the power measuring accuracy of the wireless power measurement device.

2. The method as defined in claim 1, further comprising tuning the wireless power measurement device by iteratively adapting the operating points at which it is operated to minimize the difference between the key power absorption parameters as obtained for the calibration object and the key power absorption parameters retrieved from the data storage associated with the calibration object.

3. The method as defined in claim 1, wherein the wireless power measurement device is a wireless power transmitter device subject to a wireless power transfer compliance test.

4. The method as defined in claim 1, wherein the inanimate calibration object is a physical object, the electromagnetic absorption properties of which remain invariant over time.

5. The method as defined in claim 1, wherein the inanimate calibration object is a physical object, the electromagnetic absorption properties of which change deterministically over time.

6. The method as defined in claim 1, wherein the inanimate calibration object is selected from the group consisting of:
   a solid metal object;
   a volume of a liquid metal; and
   an object made of a composite material.

7. The method as defined in claim 1, wherein the operating points are defined directly or indirectly by one or more of the following:
   electromagnetic field frequency;
   electromagnetic field magnitude;
   electromagnetic field shape;
   electromagnetic field direction; and
   surface temperature.

8. The method as defined in claim 1, wherein the key power absorption parameters are defined by one or more of the following:
   wireless transmitter coil current;
   wireless transmitter coil voltage;
   transmitted wireless power;
   electric impedance; and
   wireless transmitter coil Q factor.

9. A system for evaluating a power measuring accuracy of a wireless power measurement device under test, the system further comprising:
   a data storage which is associated with an inanimate calibration object; and
   a host device being configured for:
      retrieving, from the data storage, stored key power absorption parameters for the calibration object together with data that defines operating points;
      causing the wireless power measurement device to operate at the operating points defined by the retrieved data, thereby subjecting the calibration object to electromagnetic field variations;

obtaining key power absorption parameters of the calibration object resulting from the electromagnetic field variations; and comparing the obtained key power absorption parameters and the retrieved key power absorption parameters to obtain a measurement result being indicative of the power measuring accuracy of the wireless power measurement device.

10. The system as defined in claim 9, wherein said key power absorption parameters and said data that defines operating points have been pre-stored in said data storage by operating said data storage in a system for providing a secondary reference for subsequent use in evaluating a power measuring accuracy of a wireless power measurement device under test, the system comprising a reference wireless power transmitter device, a host device and a data storage, wherein the reference wireless power transmitter device and the host device are configured for:

subjecting an inanimate calibration object to electromagnetic field variations by controlling operating points of the reference wireless power transmitter device; and generating key power absorption parameters of the calibration object resulting from the electromagnetic field variations, and wherein the data storage is configured for:

storing the generated key power absorption parameters together with data that defines the operating points in a data storage being associated with the calibration object.

* * * * *